(12) United States Patent
Xia et al.

(10) Patent No.: US 8,445,884 B2
(45) Date of Patent: May 21, 2013

(54) MEMRISTOR WITH NANOSTRUCTURE ELECTRODES

(75) Inventors: Qiangfei Xia, Menlo Park, CA (US); Jing Tang, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 84 days.

(21) Appl. No.: 13/130,830

(22) PCT Filed: Jan. 15, 2009

(86) PCT No.: PCT/US2009/031144
§ 371 (c)(1),
(2), (4) Date: May 24, 2011

(87) PCT Pub. No.: WO2010/082929
PCT Pub. Date: Jul. 22, 2010

(65) Prior Publication Data
US 2011/0227032 A1 Sep. 22, 2011

(51) Int. Cl.
*H01L 29/02* (2006.01)

(52) U.S. Cl.
USPC ..... 257/2; 257/3; 257/4; 257/5; 257/E29.002; 438/102; 438/103; 438/104; 361/163; 977/762; 977/943

(58) Field of Classification Search
USPC ... 257/1–5, E29.002; 438/102–104; 361/163; 977/762, 943
See application file for complete search history.

(56) References Cited

U.S. PATENT DOCUMENTS

| 7,087,946 | B2 | 8/2006 | Chen et al. |
| 2005/0162881 | A1 | 7/2005 | Stasiak et al. |
| 2005/0221473 | A1* | 10/2005 | Dubin et al. ............... 435/287.2 |
| 2007/0200175 | A1 | 8/2007 | Matsui et al. |
| 2008/0090337 | A1 | 4/2008 | Williams |
| 2009/0278111 | A1* | 11/2009 | Pop .................................. 257/4 |
| 2011/0024714 | A1* | 2/2011 | Wu et al. .......................... 257/4 |

OTHER PUBLICATIONS

International Search Report, Sep. 8, 2009, PCT Application No. PCT/US2009/031144, Filed Jan. 15, 2009.
Yang, J. Joshua, et al. "Memristive switching mechanism for metal/oxide/metal nanodevices." Nature nanotechnology 3.7 (2008): 429-433.

* cited by examiner

*Primary Examiner* — Jami M Valentine

(57) ABSTRACT

A memristor having an active region includes a first electrode. The first electrode comprises a nanostructure formed of at least one metallic single walled nanotube. The memristor also includes a second electrode formed of at least one metallic single walled nanotube. The second electrode is positioned in a crossed relationship with respect to the first electrode. The memristor further includes a switching material positioned between the first electrode and the second electrode, in which the active region is configured to form in the switching material at a cross point of the first electrode and the second electrode.

11 Claims, 6 Drawing Sheets

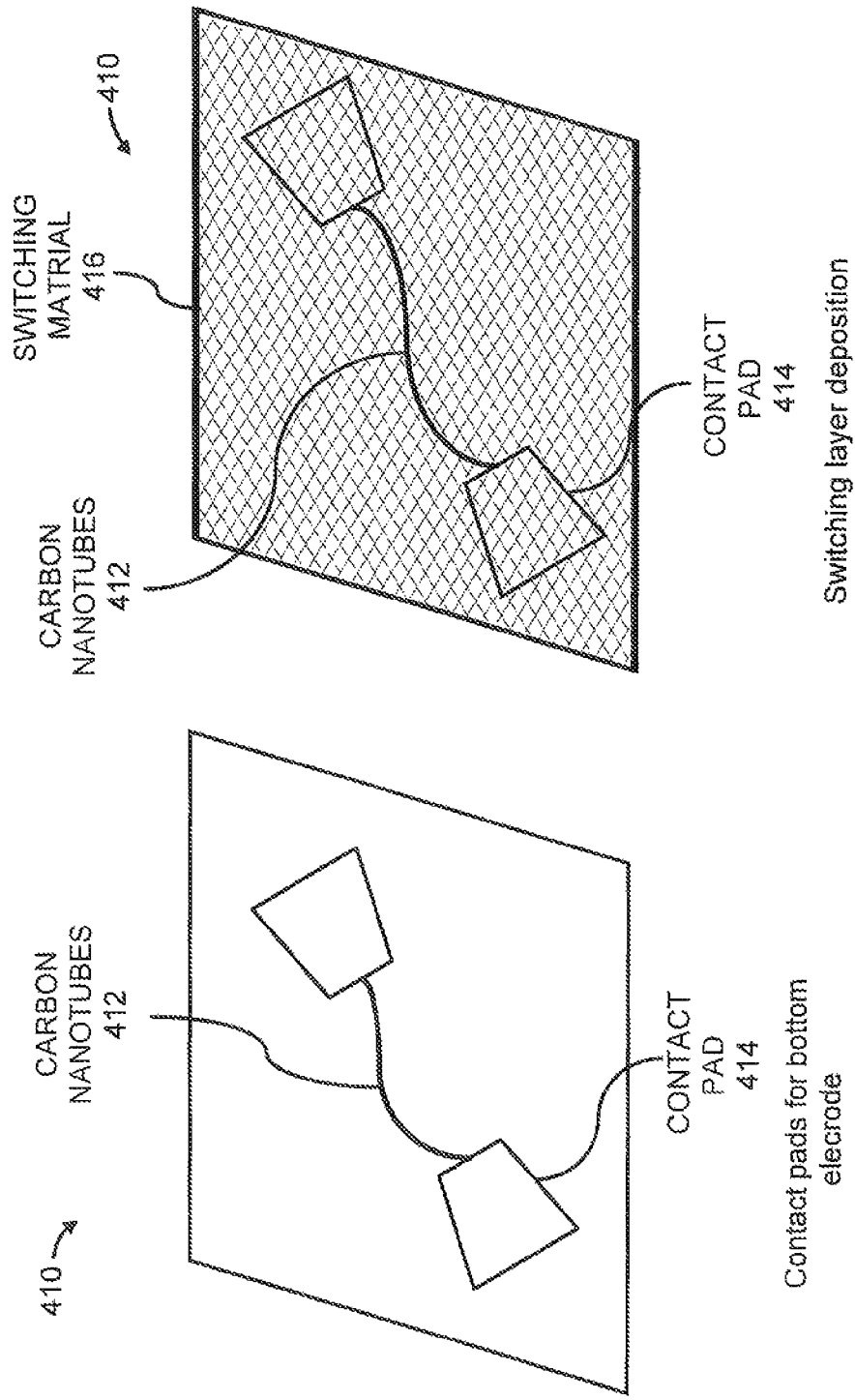

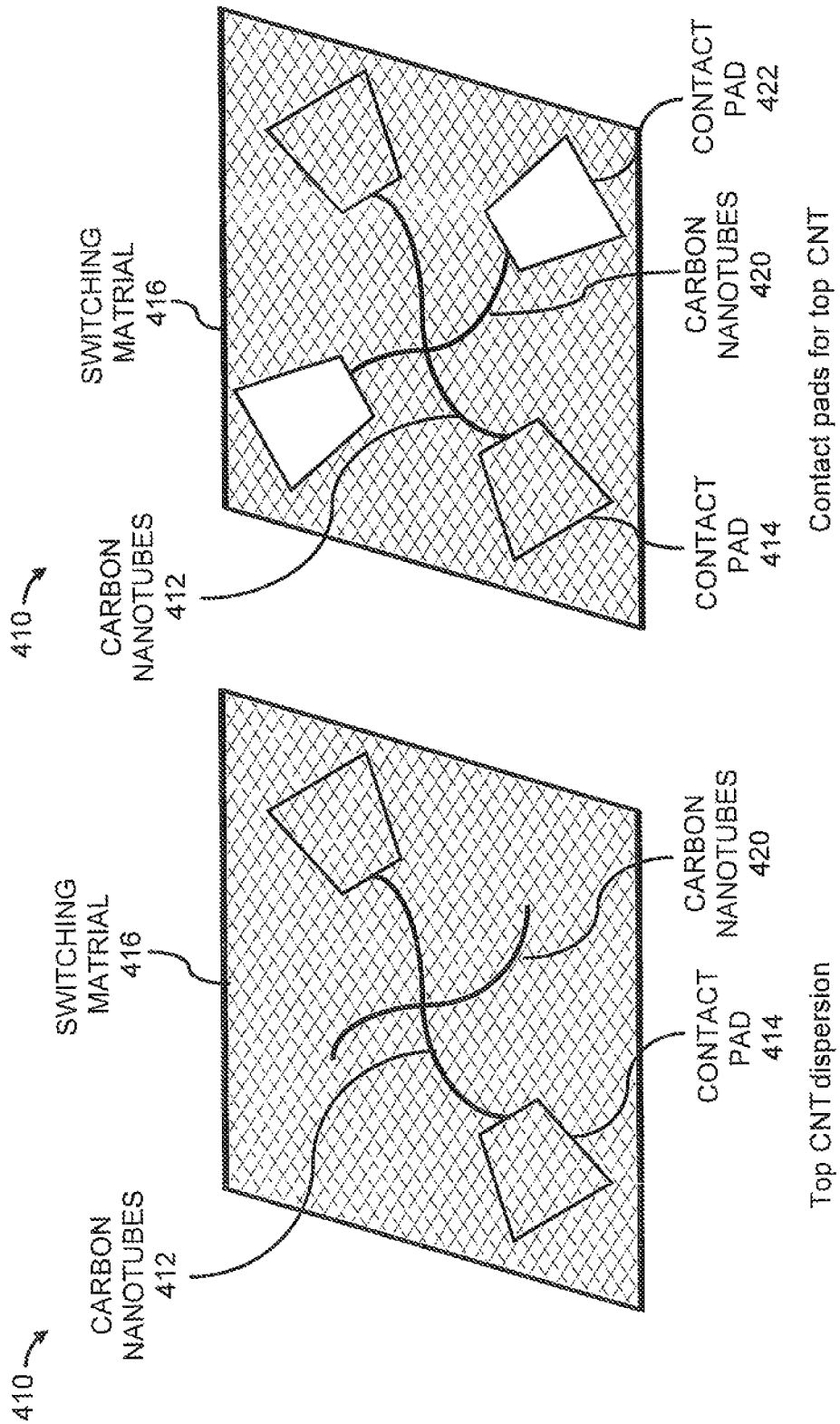

MEMRISTOR WITH NANOSTRUCTURE ELECTRODES

CROSS-REFERENCE TO RELATED APPLICATION

The present application has the same Assignee and shares some common subject matter with U.S. Patent Application Publication No. 20080090337, filed on Oct. 3, 2006, by R. Stanley Williams, the disclosure of which is hereby incorporated by reference in its entirety.

BACKGROUND

Solid state memristive devices rely on the drift of mobile charge dopants upon the application of an electrical field, as discussed in the 20080090337 Patent Publication. These types of devices have been found to have promising properties in the fields of both digital and analog non-volatile electronic logic. To illustrate the increase potential of analog non-volatile electronic logic, synaptic computing has emerged as a potential technology that is enabled by the relatively small size, low cost, and low power consumption provided by solid state memristive devices.

Researchers have designed nano-scale reversible switches with an ON-to-OFF conductance ratio of $10^4$. Crossbar circuitry is often constructed using these types of switches. A useful configuration of this crossbar circuitry is a latch, which is an important component for constructing logic circuits and communicating between logic and memory. Researchers have described logic families entirely constructed from crossbar arrays of switches, as well as hybrid structures using switches and transistors. The devices that are presently fabricated have room for improvement particularly in terms of cyclability.

BRIEF DESCRIPTION OF THE DRAWINGS

Embodiments are illustrated by way of example and not limited in the following figure(s), in which like numerals indicate like elements, in which:

FIGS. 4A to 4F, collectively, illustrate a process of fabricating the memristors depicted in FIGS. 1A and 1B, according to an embodiment of the invention.

DETAILED DESCRIPTION

Figure 1A:
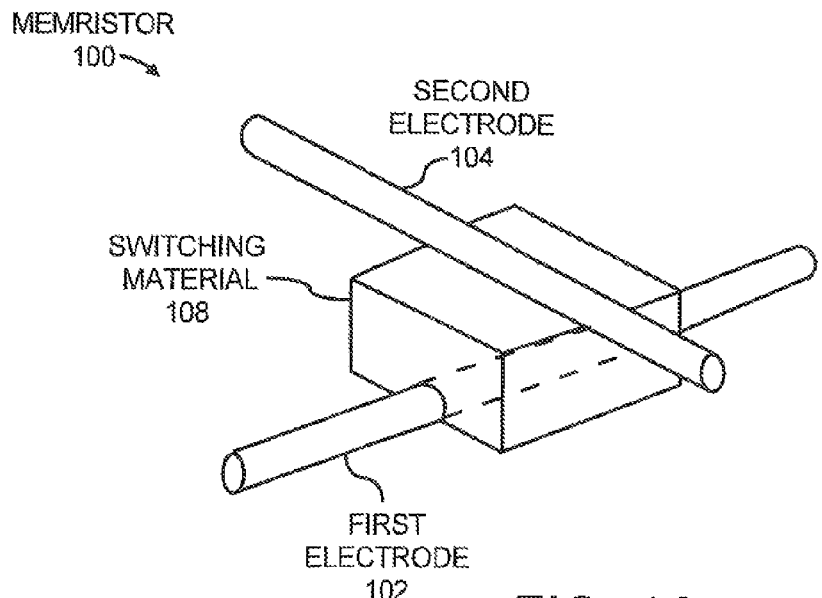
FIG. 1A illustrates a perspective view of a memristor having a first electrode with a second electrode, according to an embodiment of the invention.

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In other instances, well known methods and structures are not described in detail so as not to unnecessarily obscure the description of the embodiments.

As used herein, the term "self-aligned" as applied to "junction" means that the junction that forms the switch and/or other electrical connection between two wires is created wherever two wires, either of which may be coated or functionalized, cross each other, because it is the act of crossing that creates the junction.

The term "self-assembled" as used herein refers to a system that naturally adopts some geometric pattern because of the identity of the components of the system; the system achieves at least a local minimum in its energy by adopting this configuration.

The term "singly configurable" means that a memristor is able to change its state only once via an irreversible process such as an oxidation or reduction reaction; such a switch may be the basis of a programmable read only memory (PROM), for example.

The term "reconfigurable" means that a memristor can change its state multiple times via a reversible process such as an oxidation or reduction; in other words, the memristor may be opened and closed multiple times such as the memory bits in a random access memory (RAM).

The term "configurable" means either "singly configurable" or "reconfigurable".

Micron-scale dimensions refer to dimensions that range from 1 micrometer to a few micrometers in size.

Sub-micron scale dimensions refer to dimensions that range from 100 nm to 1 micron and nano-scale dimensions refer to dimensions that range from 1 nm to 100 nm.

Nanostructures have nano-scale dimensions and comprise wires, rod or ribbon-shaped conductors or semiconductors with widths or diameters having nanoscale dimensions, and lengths of several micrometers or longer.

A memristor is a two-terminal dynamical electrical device that acts as a passive current limiter in which the instantaneous resistance state is a function of bias history. One embodiment of a memristor is a two-terminal device in which the electrical flux, or time intergral of the electric field, between the terminals is a function only of the amount of electric charge, or time intergral of the current, that has passed through the device.

A crossbar is an array of switches, here memristors, that can connect each nanostructure in one set of approximately parallel nanostructures to every member of a second set of approximately parallel nanostructures that intersects the first set (usually the two sets of nanostructure are approximately perpendicular to each other, but this is not a necessary condition).

As used herein, the functional dimension of the memristor is measured in nanometers (typically less than 50 nm), but the lateral dimensions may be nanometers, sub-microns or microns.

With reference first to FIG. 1A, there is shown a perspective view of a memristor 100, according to an embodiment. It should be understood that the memristor 100 depicted in FIG. 1A may include additional components and that some of the components described herein may be removed and/or modified without departing from a scope of the memristor 100. It should also be understood that the components depicted in FIG. 1A are not drawn to scale and thus, the components may have different relative sizes with respect to each other than as shown therein.

As depicted in FIG. 1A, the memristor 100 includes a first electrode 102 and a second electrode 104, where the first electrode 102 is in a crossed arrangement with the second electrode 104. Both the first electrode 102 and the second electrode 104 are nanostructures having at least one nanotube that is at least a few nanometers in diameter or width. By way of particular example, both the first electrode 102 and the second electrode 104 are formed of metallic single walled carbon nanotubes, each of which is between about 1-10 nm in diameter or width.

Also shown in FIG. 1A is a switching material 108 positioned between the first electrode 102 and the second electrode 104. Although the second electrode 104 has been depicted as being positioned on the switching material 108, in various instances, the second electrode 104 may be formed in the switching material 108. In any regard, the switching material 108 is composed of a metal oxide, such as, $TiO_2$. In one regard, the switching material 108 is configured to have a conductive channel formed into the material by a localized field-driven atomic modification. In another embodiment, the switching material 108 is formed of any suitable material that is formed of molecules having a switchable segment or moiety that is relatively energetically stable in two different states. Various properties of the switching material 108 and interactions between the first electrode 102, the second electrode 104 and the switching material 108 are described in greater detail herein below with respect to FIG. 1B.

Figure 1B:
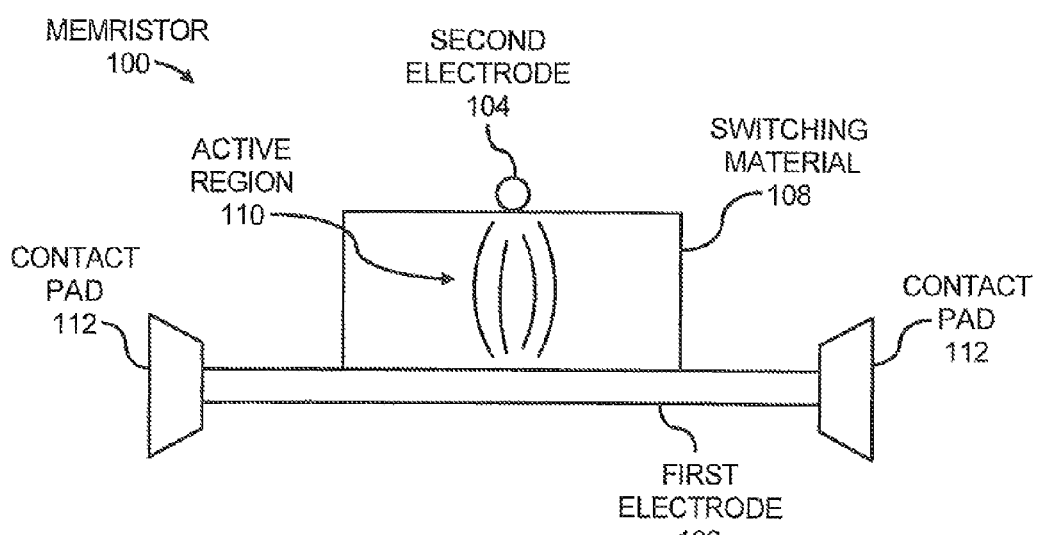
FIG. 1B illustrates a side view of a memristor having a first electrode with a second electrode, according to an embodiment of the invention.

With particular reference now to FIG. 1B, there is shown a side view of the memristor 100 shown in FIG. 1A, according to an embodiment. As shown, the first electrode 102 and the second electrode 104 are embedded in the switching material 108. Thus, for instance, the first electrode 102 may be fabricated through any of a number of conventional techniques, and the switching material 108 may be deposited or formed on the first electrode 102. In addition, the second electrode 104 may be fabricated either on or in the switching material 108 through any of a number of conventional techniques to form the memristor 100.

Also shown in FIG. 1B is an active region 110 formed in the switching material 108 at the cross point between the first electrode 102 and the second electrode 104. The active region 110 is formed in the switching material 108 when a voltage is applied across the first electrode 102 and the second electrode 104. Field lines of the active region 110 illustrate the intensity of the field between the first electrode 102 and the second electrode 104 when a voltage is applied across the electrodes.

In one embodiment, the entire switching material 108 is nonconductive. In this embodiment, a forming process is required to initiate switching behavior in the switching material 108. The forming process includes applying a sufficiently high (threshold) voltage across the first electrode 102 and the second electrode 104 for a sufficient length of time to create a conductive channel in the active region 110 of the switching material 108. The threshold voltage and the length of time required for the forming process generally depends upon the type of material used for the switching material, as well as the materials and the sizes of the first electrode 102 and the second electrode 104. In another embodiment, the switching material 108 may be engineered to have the conductive channel formed in the active region 110 without requiring the forming process.

By way of particular example, the switching material 108 is composed of a dual layer structure as described in greater detail in the above-referenced U.S. Patent Application Publication No. 20080090337. As disclosed therein, the dual layer structure of the switching material enhances the switching properties and operation of devices using electrically actuated switches constructed therewith. That application for patent also describes a wide combination of materials than can be used to facilitate the switching process using the dual layer structure.

The conductivity of the active region 110 may be modulated by applying different biases across the first electrode 102 and the second electrode 104. Thus, the memristor 100 is reconfigurable based upon the bias applied across the first electrode 102 and the second electrode 104. In other instances, the memristor 100 may include a switching material 108 that is singly configurable.

The locus of the active region 110 forms in the area where the first electrode 102 and the second electrode 104 overlap. The active region 110 is depicted as being centered within the overlap area, however, the active region 110 may form outside of the overlap area, depending upon how the electrical field between the first and second electrodes 102 and 104 forms. According to an embodiment, the overlap area of the first and second electrodes 102 and 104 will be of the order of about a few nanometers wide when the first electrode 102 and second electrode 104 are single metallic single walled carbon nanotubes. In addition, the height of the overlap area is dependent on the thickness of the switching material 108 separating the first electrode 102 from the second electrode 104. According to an embodiment, the switching material 108 has a relatively small thickness as compared with conventional electrically actuated switches due to, for instance, the relatively small diameters/widths of the first and second electrodes 102 and 104. In one regard, the relatively small thickness of the switching material 108 in the overlap area of the first electrode 102 and the second electrode 104 generally limits the probable size and location of the active region 110. Thus, the height and the width of the active region 110 formed at the intersection of the first electrode 102 and the second electrode 104 is generally smaller and its location is relatively easier to identify than the active regions of conventional electrically actuated switches.

Although the first electrode 102 and/or the second electrode 104 may be composed of a single nanotube, as described above, the first electrode 102 and/or the second electrode 104 may alternatively be composed of multiple nanotubes. Thus, for instance, one or both of the first electrode 102 and the second electrode 104 may be formed of multiple nanotubes, with each of the nanotubes having widths of a few nanometers, such as, between about 1 nm to about 10 nm. By way of particular example, one or both of the first electrode 102 and the second electrode 104 may be formed of a sufficient number of nanotubes to cause one or both of the first electrode 102 and the second electrode 104 to have a width in the range of about 10 nm to about 40 nm. Where both the first electrode 102 and second electrode 104 are comprised of multiple nanotubes or multi-walled nanotubes, the overlap area 107 will be relatively larger than when the first electrode 102 and the second electrode 104 are formed of single-walled nanotubes. Where one of the first electrode 102 and the second electrode 104 is a single metallic single walled carbon nanotube and the other is comprised of multiple nanotubes or multi-walled nanotubes, the overlap area 107 will also be relatively larger than when the first electrode 102 and the second electrode 104 are formed of single-walled nanotubes.

Although the first electrodes 102 and the second electrodes 104 depicted in FIGS. 1A and 1B are shown with circular cross-sections, the second electrodes 104 may have square, rectangular, elliptical, or more complex cross-sections, such as, triangular cross-sections. The wires may also have many different widths or diameters and aspect ratios or eccentricities. The term "nanowire crossbar" may refer to crossbars having one or more layers of sub-microscale electrodes, microscale electrodes or electrodes with larger dimensions, in addition to nanowires.

The memristors 100 depicted in FIGS. 1A and 1B may be built at the micro- or nano-scale and used as a component in a wide variety of electronic circuits. The memristors 100 may be used as the basis for memories, switches, and logic circuits, and switching functions. When used as a basis for memories, the memristors 100 may be used to store a bit of information, 1 or 0. When used as a switch, the memristors 100 may either be a closed or open switch in a cross-point memory. When used as a logic circuit, the memristors 100 may be employed as bits in a logic circuit that resembles a Field Programmable Gate Array, or as the basis for a wired-logic Programmable Logic Array. The memristors 100 disclosed herein are also configured to find uses in a wide variety of other applications.

Figure 2:
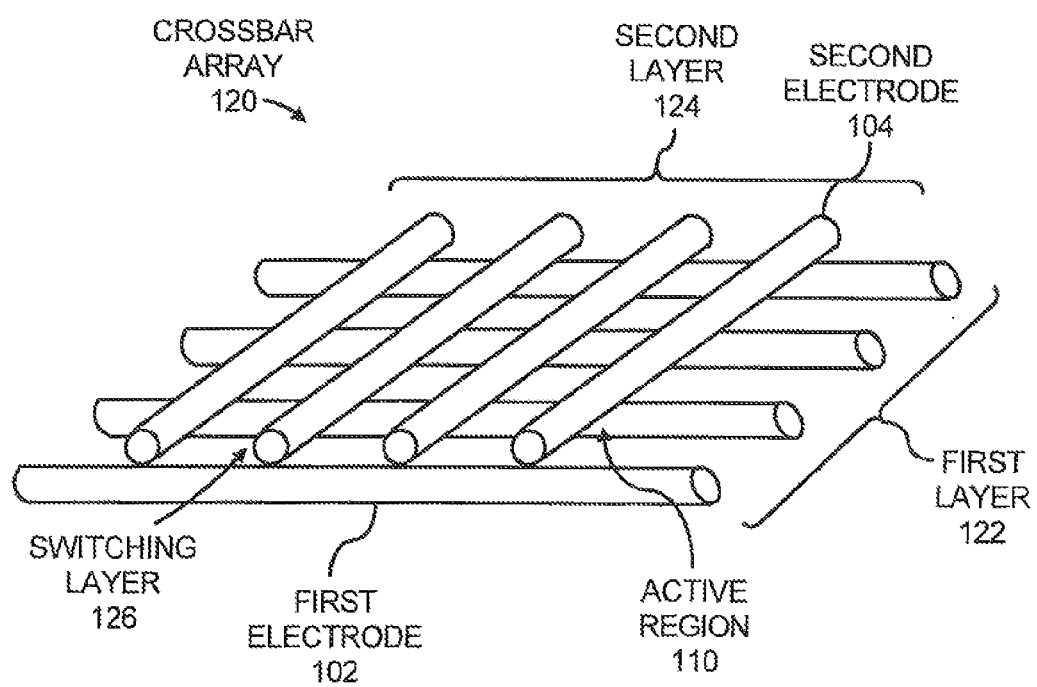
FIG. 2 illustrates a crossbar array employing a plurality of the memristors depicted in FIGS. 1A and 1B, according to an embodiment of the invention.

With reference now to FIG. 2, there is shown a crossbar array 120 employing a plurality of the memristors 100 shown in FIG. 1A, according to an embodiment. It should be understood that the crossbar array 120 depicted in FIG. 2 may include additional components and that some of the components described herein may be removed and/or modified without departing from a scope of the crossbar array 120.

As shown in FIG. 2, a first layer 122 of approximately parallel first electrodes 102 is overlain by a second layer 124 of approximately parallel second electrodes 104. The second layer 114 is roughly perpendicular, in orientation, to the first electrodes 102 of the first layer 122, although the orientation angle between the layers may vary. The two layers 122, 124 form a lattice, or crossbar, with each second electrode 104 of the second layer 124 overlying all of the first electrodes 102 of the first layer 122 and being connected with each first electrode 102 of the first layer 122. Although not explicitly shown in FIG. 2, a switching layer 126 of switching material 108 is positioned between the first layer 122 and the second layer 124, within which the active regions 110 are formed. The crossbar array 120 depicted in FIG. 1B may be fabricated from micron-, submicron or nanoscale-electrodes 102, 104, depending on the application.

Figure 3A:
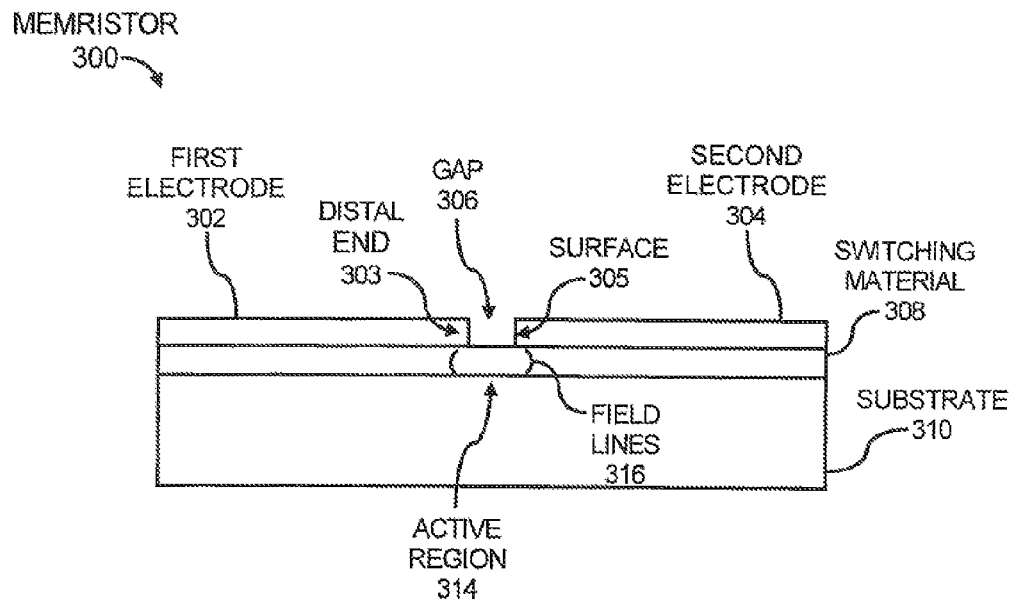
FIG. 3A illustrates a cross-sectional side view of a memristor, according to another embodiment of the invention.

With reference now to FIG. 3A, there is shown a cross-sectional side view of a memristor 300, according to another embodiment. It should be understood that the memristor 300 depicted in FIG. 3A may include additional components and that some of the components described herein may be removed and/or modified without departing from a scope of the memristor 300. It should also be understood that the components depicted in FIG. 3A are not drawn to scale and thus, the components may have different relative sizes with respect to each other than as shown therein.

As depicted in FIG. 3A, the memristor 300 includes a first electrode 302 and a second electrode 304 arranged laterally with respect to each other. Although not explicitly depicted in FIG. 3A, the length of the first electrode 302 is longer than its width and includes a distal end 303. The second electrode 302 may also have a rectangular shape with a surface 305 that faces toward the distal end of the first electrode 302. The surface 305 may be a distal end of the second electrode 302 or the surface 305 may be a side wall of the second electrode. In any regard, the distal end 303 of the first electrode 302 is spaced apart from the surface 305 of the second electrode 304 to form a gap 306 therebetween. According to an embodiment, the width of the gap 306 is in the range of between about 2 to 20 nm or larger. In addition, the first electrode 302 and the second electrode 304 are positioned upon a switching material 308, which is positioned upon a substrate 310. The switching material 308 may comprise any of the materials discussed above with respect to the switching material 108, such as, $TiO_2$.

In the embodiment depicted in FIG. 3A, when a voltage is applied across the first electrode 302 and the second electrode 304, an active region 314 forms in the switching material 308. The active region 314 generally has a locus in the switching material 308 adjacent the gap 306 between the first electrode 302 and the second electrode 304, and is thus formed laterally beneath the first electrode 302 and the second electrode 304, as depicted by the field lines 316.

According to an embodiment, the first electrode 302 and the second electrode 304 are nanostructures, similar to the first and second electrodes 102 and 104 discussed above. The active region 314 is the location where a conduction channel is formed in the switching material 308. Because the electric field and consequent conduction channel is formed in the area adjacent the gap 306, the location of the active region 314 is relatively easy to identify.

Figure 3B:
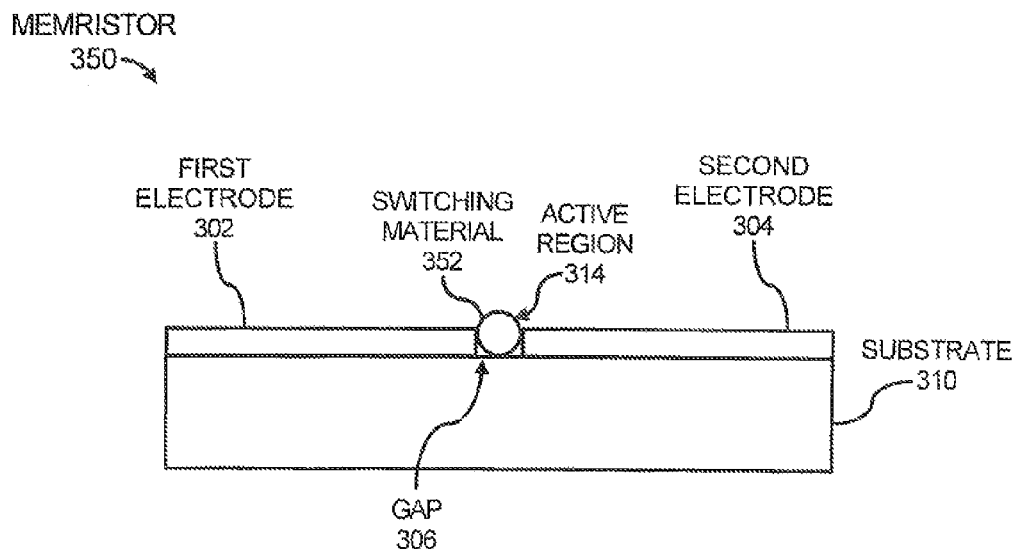
FIG. 3B illustrates a cross-sectional side view of a memristor, according to a further embodiment of the invention.

Turning now to FIG. 3B, there is shown a cross-sectional side view of a memristor 350, according to a further embodiment. It should be understood that the memristor 350 depicted in FIG. 3B may include additional components and that some of the components described herein may be removed and/or modified without departing from a scope of the memristor 350. It should also be understood that the components depicted in FIG. 3B are not drawn to scale and thus, the components may have different relative sizes with respect to each other than as shown therein.

In addition, the memristor 350 depicted in FIG. 3B contains many of the same elements as those depicted in the memristor 300 shown in FIG. 3A. As such, detailed descriptions of those elements having the same reference numerals are not reproduced herein with respect to the description of FIG. 3B.

As depicted in FIG. 3B, instead of the switching material 308, the memristor 350 includes a switching material 352 positioned in the gap 306. The switching material 352 may comprise any of the materials discussed above with respect to the switching material 108, such as, $TiO_2$.

In the embodiment depicted in FIG. 3B, when a voltage is applied across the first electrode 302 and the second electrode 304, an active region 314 forms in the switching material 352. The switching material 352 generally has a diameter that is approximately equal to the width of the gap 306 between the first electrode 302 and the second electrode 304 and is in electrical contact with the first electrode 302 and the second electrode 304. According to an embodiment, the width of the switching material 352 is of the order of a typical electrical conduction channel formed in a switching material 108. As such, substantially the entire width of the switching material 352 becomes the active region 314 of the resulting memristor 350.

The memristors 300 and 350 depicted in FIGS. 3A and 3B may be built at the micro- or nano-scale and used as a component in a wide variety of electronic circuits. The memristors 300 and 350 may be used as the basis for memories and logic circuits and switching functions. When used as a basis for memories, the memristors 300 and 350 may be used to store a bit of information, 1 or 0. When used as a switch, the memristors 300 and 350 may either be a closed or open switch in a cross-bar memory. When used as a logic circuit, the memristors 300 and 350 may be employed as bits in a logic circuit that resembles a Field Programmable Gate Array, or as the basis for a wired-logic Programmable Logic Array. The memristors 300 and 350 disclosed herein are also configured to find uses in a wide variety of other applications.

FIGS. 4A to 4F collectively illustrate a process of fabricating the memristor depicted in FIGS. 1A and 1B, according to an embodiment. It should be understood that the process of fabrication for the memristor 100 depicted in FIGS. 4A to 4F may include additional steps and that some of the steps described herein may be removed and/or modified without departing from a scope of the process of fabrication for the memristor 100. It should also be understood that the memristor 100 is one embodiment and that other memristors may be made without departing from a scope of the invention.

Figure 4A:
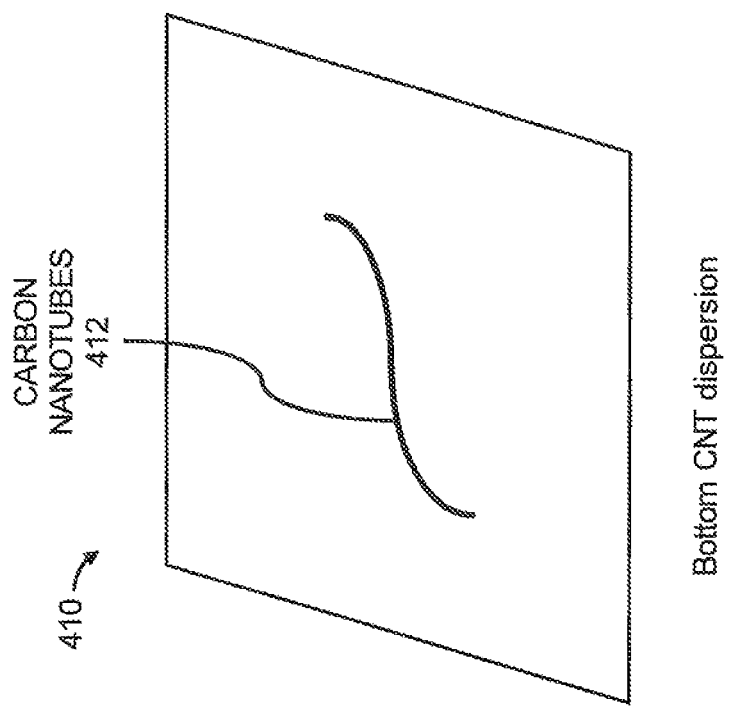
Figure 4B:
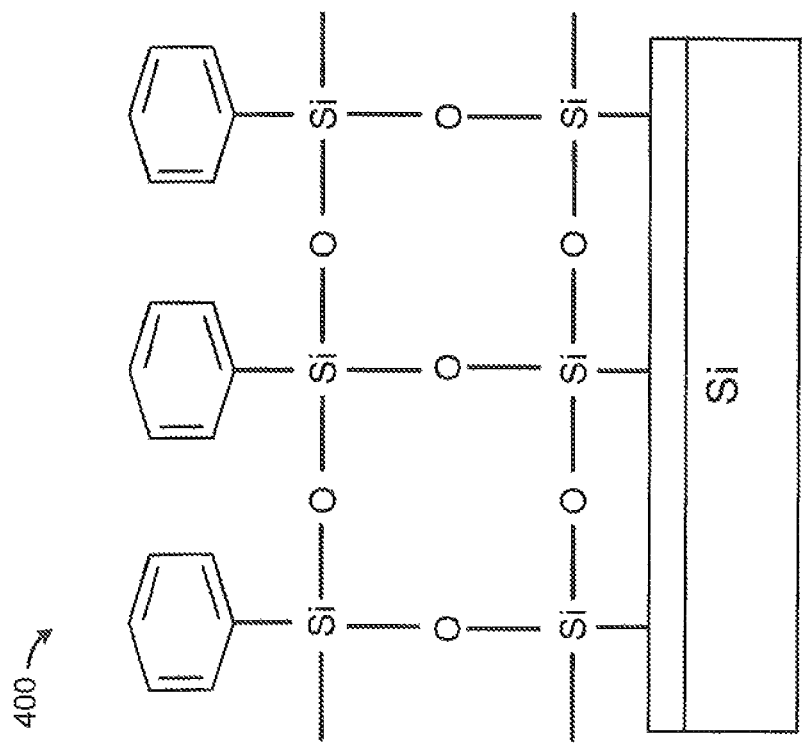

According to an embodiment, the first electrode 102 and the second electrode 104 are formed of metallic single walled carbon nanotubes, which are known to have relatively small sizes and strong conductivity. In addition, the metallic single walled carbon nanotubes may be separated from semiconductor carbon nanotubes through selective binding, as shown in FIG. 4A, as discussed, for instance, in the article "Self-Sorted, Aligned Nanotube Networks for Thin-film Transistors" by Melburne C. LeMieux et al., Science, vol. 321, pages 101-104, Jul. 4, 2008, the disclosure of which is hereby incorporated by reference in its entirety. FIG. 4A, more particularly, depicts a process of separating the metallic single walled carbon nanotubes, which begins with functionalization of the silicon dioxide on top of the silicon. Metallic single walled carbon nanotubes tend to bind with phenyl-terminated silane and semiconductor carbon nanotubes tend to bind with amine-terminated silane. As known to those skilled in the art, spin coating of the carbon nanotube substrate suspension may be used for sorting of the metallic single walled carbon nanotubes and the semiconductor carbon nanotubes, leaving the resulting separated metallic single walled carbon nanotubes 412 as shown in the diagram 410 FIG. 4B.

As shown in FIG. 4C, contact pads 414 for the carbon nanotubes 412, which may form the first electrode 102, 302, are positioned in electrical contact with the carbon nanotubes 412. According to an example, the contact pads 414 are used for measurement of the electrical activity in the memristors 100, 300, 350 formed of the carbon nanotubes 412.

As shown in FIG. 4D, switching material 416, such as, the switching material 108, is deposited over the carbon nanotubes 412. The switching material 416 may also be deposited over the contact pads 414.

FIG. 4E depicts the application of another set of carbon nanotubes 420 on top of the switching material 416, for instance, through functionalization of the silicon dioxide on top of the silicon, such that, another set of carbon nanotubes 420 crosses over a portion of the originally laid carbon nanotubes 412. The location where the another set of carbon nanotubes 420 crosses the originally laid carbon nanotubes 412 is considered as the location of a memristor 100. According to an example, the carbon nanotubes 420 comprise metallic single walled carbon nanotubes and may be separated from semiconductor carbon nanotubes through selective binding as discussed above with respect to FIG. 4A. In addition, or alternatively, the another set of carbon nanotubes 420 may be positioned over the originally laid carbon nanotubes 412 after the another set of carbon nanotubes 420 has been fabricated.

FIG. 4F illustrates the placement of contact pads 422 to be in electrical contact with the another set of carbon nanotubes 420. The contact pads 422 may be used for measurement of the electrical activity in the memristor 100 formed of the carbon nanotubes 412 and 420.

The memristors 300 and 350 may be fabricated in similar manners to those discussed above with respect to the memristor 100, with various modifications. For instance, in the memristors 300 and 350, the first electrode 302 may be fabricated and the second electrode 304 may be fabricated and positioned to create the gap 306 therebetween as shown in FIGS. 3A and 3B. In addition, the switching material 352 depicted in FIG. 3B may be positioned in the gap 306.

Although particular processes for fabricating the memristors disclosed herein have been provided, it should be understood that other fabrication methods may also be used to fabricate the memristors 100, 300, 350 without departing from a scope of the invention disclosed herein.

What has been described and illustrated herein is an embodiment along with some of its variations. The terms, descriptions and figures used herein are set forth by way of illustration only and are not meant as limitations. Those skilled in the art will recognize that many variations are possible within the spirit and scope of the subject matter, which is intended to be defined by the following claims—and their equivalents—in which all terms are meant in their broadest reasonable sense unless otherwise indicated.

What is claimed is:

1. A crossbar array, said crossbar array comprising:
   a switching material layer;
   a plurality of first electrodes, wherein each of the plurality of first electrodes comprises a nanostructure formed of at least one metallic single walled nanotube, said plurality of first electrodes being positioned approximately parallel with respect to each other on the switching material layer, wherein each of the plurality of first electrodes has a distal end; and
   a plurality of second electrodes, wherein each of the plurality of second electrodes comprises a nanostructure formed of at least one metallic single walled nanotube, said plurality of second electrodes having respective surfaces at distal ends thereof, said plurality of second electrodes being positioned approximately parallel with respect to each other on the switching material layer such that the plurality of second electrodes are substantially coplanar with respective ones of the plurality of first electrodes, wherein each of the surfaces of the plurality of second electrodes is spaced from and faces the distal end of a substantially coplanar first electrode to form a gap therebetween,
   wherein the switching material layer is in electrical contact with the plurality of first electrodes and the plurality of second electrodes such that respective active regions are to be formed in the switching material layer at locations beneath the gaps between the plurality of first electrodes and the plurality of second electrodes.

2. The crossbar array of claim 1, wherein each of the plurality of first electrodes comprises one metallic single walled nanotube.

3. The crossbar array of claim 1, wherein at least one of the plurality of first electrodes and the plurality of second electrodes comprises a width between about 1 nm to about 10 nm.

4. The crossbar array of claim 1, wherein at least one of the plurality of first electrodes and the plurality of second electrodes comprises at least one of multiple nanotubes and a metallic multi-walled nanotube.

5. The crossbar array of claim 1, wherein at least one of the plurality of first electrodes and the plurality of second electrodes comprises a width of between about 10 nm to about 40 nm.

6. A memristor having an active region, said memristor comprising:
   a first electrode, wherein the first electrode comprises a nanostructure formed of at least one metallic single walled nanotube, said first electrode having a distal end;
   a second electrode, wherein the second electrode comprises a nanostructure formed of at least one metallic single walled nanotube, said second electrode having a surface, wherein the second electrode is substantially coplanar with the first electrode and wherein the surface of the second electrode is spaced from the distal end of the first electrode to form a gap, wherein the distal end of the first electrode faces the surface of the second electrode across the gap; and a switching material layer in electrical contact with the first electrode and the second electrode, wherein the first electrode and the second electrode are positioned on the switching material layer such that the first electrode and the second electrode extend laterally with respect to the switching material layer, and wherein the active region is to be formed in the switching material layer located beneath the gap between the first electrode and the second electrode.

7. The memristor of claim 6, wherein the nanostructure of at least one of the first electrode and the second electrode comprises a single metallic single walled nanotube.

8. The memristor of claim 7, wherein at least one of the first electrode and the second electrode comprises a width between about 1 nm to about 10 nm.

9. The memristor of claim 6, wherein at least one of the first electrode and the second electrode comprises at least one of multiple nanotubes and a metallic multi-walled nanotube.

10. The memristor of claim 6, wherein at least one of the first electrode and the second electrode comprises a width of between about 10 nm to about 40 nm.

11. A method for fabricating a memristor, said method comprising:

providing a switching material layer;

providing, on the switching material layer, a first electrode that comprises a nanostructure formed of at least one metallic single walled nanotube and having a distal end;

providing, on the switching material layer, a second electrode that comprises a nanostructure formed of at least one metallic single walled nanotube and having a surface on a distal end of the second electrode, wherein providing the second electrode further comprises positioning the second electrode to extend in a substantially coplanar manner with the first electrode and to space the surface of the second electrode from the distal end of the first electrode to form a gap therebetween; and wherein an active region is be formed in the switching material layer at a location beneath the gap between the first electrode and the second electrode.

\* \* \* \* \*

UNITED STATES PATENT AND TRADEMARK OFFICE
CERTIFICATE OF CORRECTION

PATENT NO. : 8,445,884 B2  
APPLICATION NO. : 13/130830  
DATED : May 21, 2013  
INVENTOR(S) : Qiangfei Xia et al.

Page 1 of 1

It is certified that error appears in the above-identified patent and that said Letters Patent is hereby corrected as shown below:

In the Claims:

In column 10, line 21, in Claim 11, delete "is" and insert -- is to --, therefor.

Signed and Sealed this  
First Day of October, 2013

Teresa Stanek Rea  
*Deputy Director of the United States Patent and Trademark Office*